United States Patent [19]

Molinaro

[11] Patent Number: 4,854,623
[45] Date of Patent: Aug. 8, 1989

[54] END EFFECTOR

[75] Inventor: James S. Molinaro, Whitehall, Pa.

[73] Assignee: Dexton, Inc., Minneapolis, Minn.

[21] Appl. No.: 150,048

[22] Filed: Jan. 29, 1988

[51] Int. Cl.$^4$ .................. B65D 25/28; B65D 71/00
[52] U.S. Cl. ........................................ 294/1.1; 294/15
[58] Field of Search .............. 294/1.1, 15, 16, 68.1, 294/26.5, 27.1, 31.2, 87.1, 34, 172; 206/328, 316, 445, 334

[56] References Cited

U.S. PATENT DOCUMENTS 3,272,350  9/1966  Pflaumer et al. ................ 294/15
4,723,799  2/1988  Wollman et al. ................ 294/1.1

Primary Examiner—James B. Marbert
Attorney, Agent, or Firm—Hugh D. Jaeger

[57] ABSTRACT

A passive cassette robotic end effector, without any moving parts, used for directly handling individual wafer cassettes. A pair of opposing arms of the end effector, each a mirror image of the other, secures to an independent external robotic handler mounting plate. The end effector positions about either end of the wafer cassette under cassette wall reinforcement bars located on opposing sides of a wafer cassette. Cavities with ramped alignment walls on the upper inner portion of each arm of the end effector accommodates and engages the cassette wall reinforcement bars.

2 Claims, 4 Drawing Sheets

END EFFECTOR

BACKGROUND OF THE INVENTION

1. Field of the Invention

The present invention relates to robotic handling equipment, and more particularly, pertains to a robotic end effector for the handling of wafer cassettes. The robotic end effector has no moving parts.

2. Description of the Prior Art

Prior art devices for gripping or handling wafer carriers or wafer cassettes would sometimes cause breakage of the wafers or particle contamination of the wafers. Prior art devices were handles or other types of gripping devices which would not always grip the carriers or cassettes with even pressure or even strength.

The present invention provides an end effector for robotic handling which uses no moving parts.

SUMMARY OF THE INVENTION

The present invention pertains to a robotic end effector for the handling of wafer cassettes in a clean-room environment. The end effector can be of predetermined dimensions to accommodate different size wafer cassettes or reinforcement bars about the cassettes.

According to one embodiment of the present invention, there is provided a pair of opposing arms of a passive end effector, each a mirror image of the other. Each arm of the end effector includes a longitudinal member oriented perpendicular to a holed mounting flange. A multi-sided cavity on the inside upper surface of each arm of the end effector includes a flat planar surface intersecting a longer ramped wall, and two shorter ramped walls which are intersected and are at an angle to the longer ramped wall. The ramp of the walls guide the reinforcement bars of a wafer cassette onto the flat planar surfaces of the arms of the end effector. Wafer carrier and wafer cassette are synonymous terms.

One significant aspect and feature of the present invention is an end effector with no moving parts nor moving mechanisms.

Another significant aspect and feature of the present invention is the employment of cavities with ramped side walls to guide and orient the reinforcement bars of a wafer cassette onto the flat planar surface of each individual arm of the end effector.

Yet another significant aspect and feature of the present invention is that the passive end effector can engage a wafer cassette from either end of the wafer cassette.

Having thus described one embodiment of the present invention, it is a principal object hereof to provide a passive end effector for engagement with and robotic handling of the reinforcement bars of wafer cassettes.

Another object of the present invention is the use of ramped surfaces to center a wafer cassette in the end effector arms.

DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
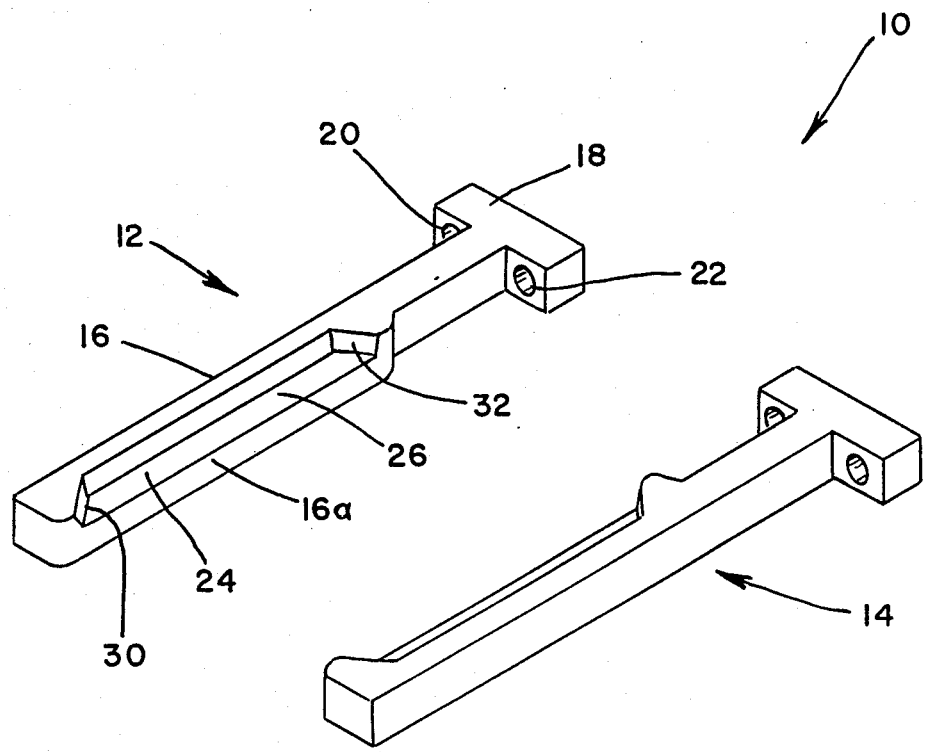
FIG. 1 illustrates a perspective view of the passive robotic end effector, the present invention.

FIG. 1 illustrates a perspective view of a passive cassette robotic end effector 10, herein known as and referred to as an end effector 10, for the direct handling of an individual wafer cassette. The end effector 10 includes a left end effector arm 12 and a right end effector arm 14 which are fabricated of materials, such as stainless steel, aluminum, Teflon, a polymer or fluorocarbon, or any other suitable material for processing applications. The right end effector arm 14 is a mirror image of the left end effector arm 12. The left end effector arm 12 includes a longitudinal member 16 perpendicular to a mounting flange 18. Mounting flange 18 includes holes 20 and 22. The longitudinal member 16 includes a widened section 16a in which a cavity 24 is located for the accommodation of a cassette wall reinforcement bar of a cassette. The cavity 24 includes a flat planar surface 26, long ramped wall 28, and shorter ramped walls 30 and 32 adjacent to the long ramped wall 28. The ramped walls 28–32 angle inwardly towards and intersect with the flat planar surface 26 for centering of a cassette between the left and right end effector arms 12 and 14. The right end effector arm 14 is a mirror image of the left end effector, and includes like and corresponding mirror image elements and members including longitudinal member 34, a mounting flange 36, mounting holes 38 and 40, a cavity 42, a flat planar surface 44, a long ramped wall 46, and shorter ramped walls 48 and 50 intersecting the flat planar surface 44. The size of the cavities 24 and 42 and the length or other dimensions of the left and right end effector arms 12 and 14 can be varied and predetermined to accommodate different sizes of reinforcement bar members of different size cassettes.

Figure 2:
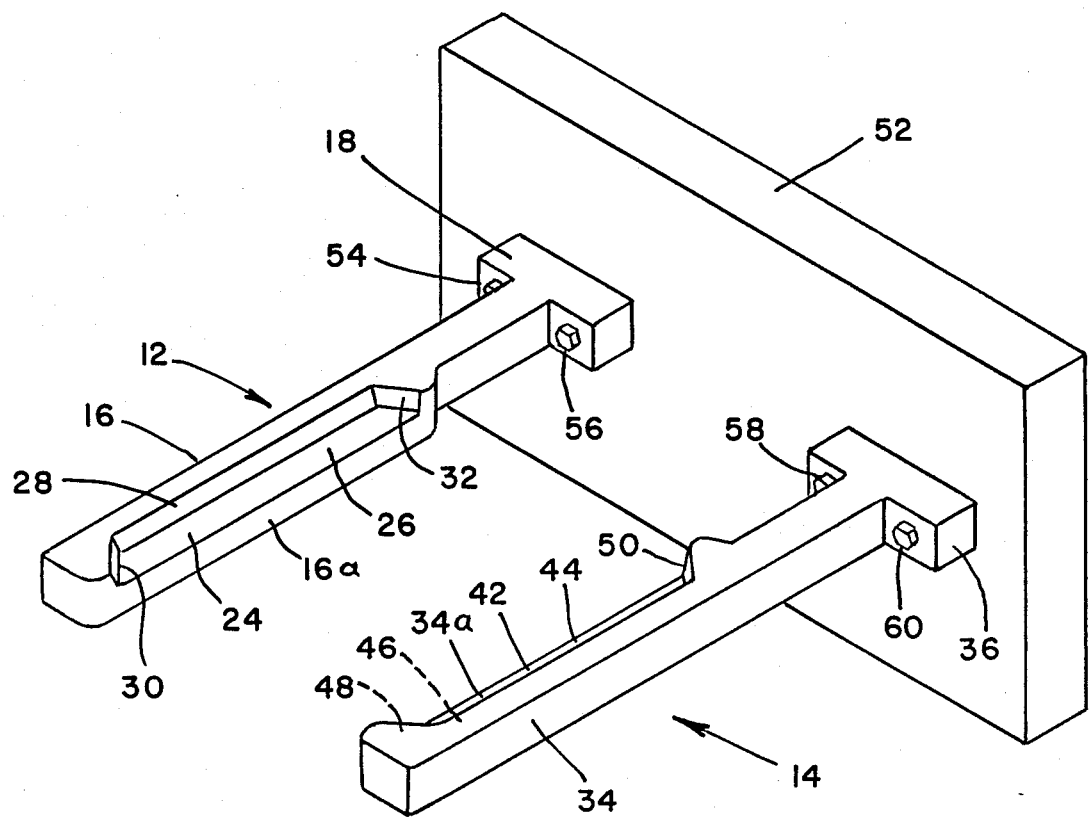
FIG. 2 illustrates arms of the passive end effector secured to an external robotic handler mounting plate.

FIG. 2 illustrates left and right end effector arms 12 and 14 of the end effector 10 secured to a robotic handler mounting plate 52 by appropriate fasteners 54–60. All other numerals correspond to those elements previously described.

MODE OF OPERATION

Figure 3:
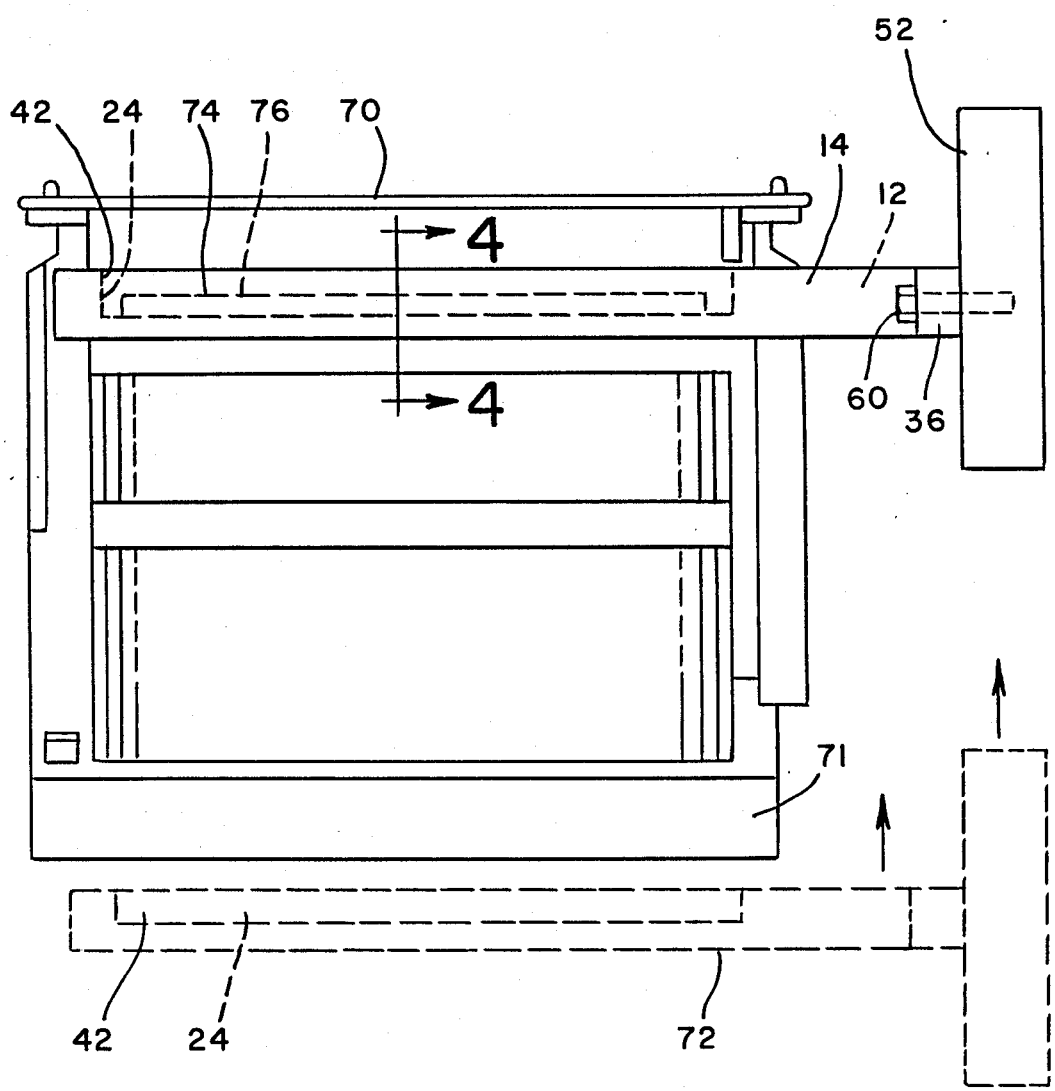
FIG. 3 illustrates a side view of the passive end effector engaging a wafer cassette; and, FIG. 4 illustrates an end view in partial cross section of the passive end effector engaging a wafer cassette.

FIG. 3 illustrates the mode of operation where the left and right end effector arms 12 and 14 of the end effector 10 secure to a robotic handler mounting plate 52 for engaging a typical cassette 70. A set of dashed lines 72 indicates one of a plurality of positions the end effector 10 can assume prior to proceeding in an upward direction to engage the reinforcement bars 74 and 76 of the cassette 70. The end effector arms 12 and 14 travel in an upward direction from the base area 71 of the cassette 70 until the cavities 42 and 24 engage reinforcement bars 74 and 76 of the cassette 70. Of course, the end effector also can be placed above the plane of the base area 71 of the cassette 70, or in any other position which would allow engagement of the reinforcement bars 74 and 76 by the cavities 42 and 24 of the left and right end effector arms 14 and 12, respectively.

Figure 4:
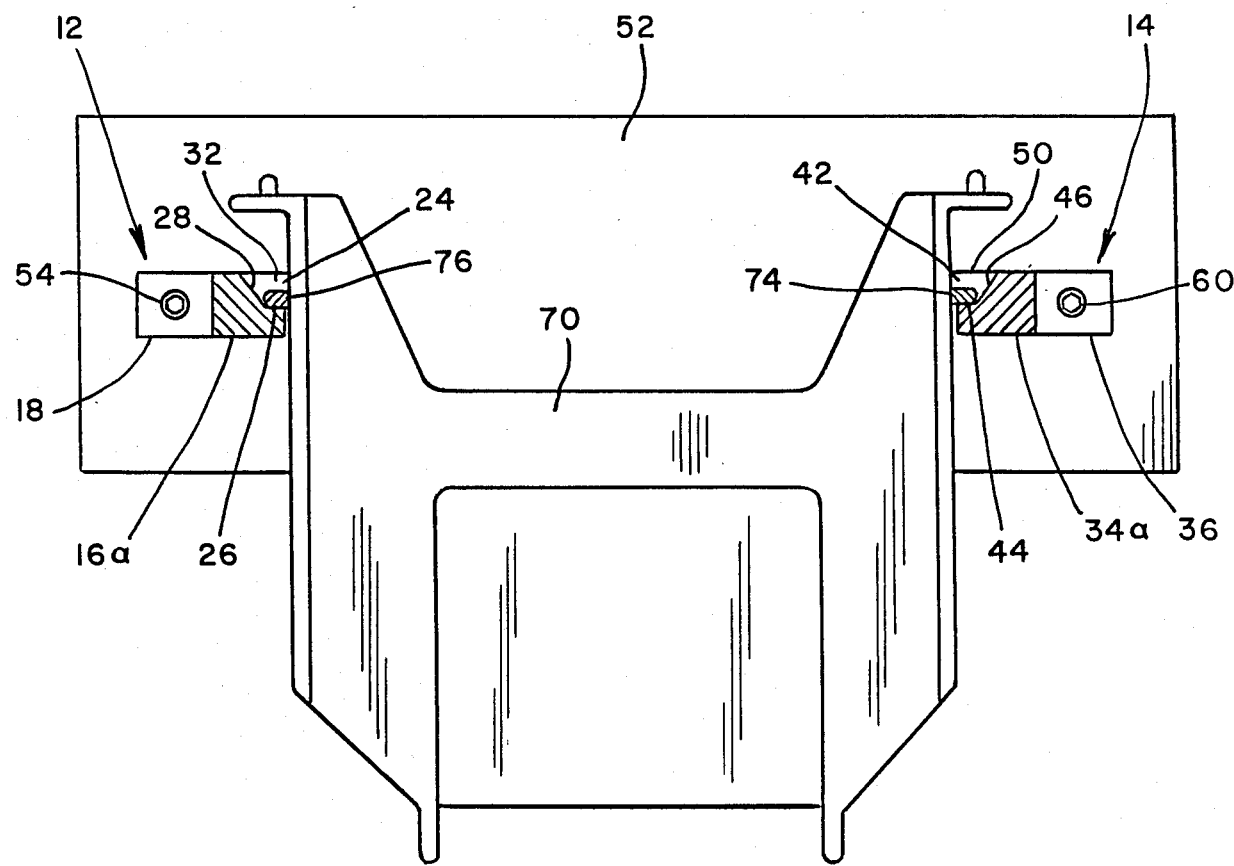

FIG. 4 illustrates an end view in partial cross section of the end effector 10 engaging the reinforcement bars 74 and 76 of cassette 70 where all numerals correspond to those elements previously described. The end effector arms 12 and 14 and reinforcement bars 74 and 76 are shown in a cross section taken along line 4—4 of FIG. 3. The end effector 10 includes a self centering and aligning feature. The ramped walls 28-32 and 46-50 of the cavities 24 and 42, as also illustrated in FIG. 1, ensure that the reinforcement bars 76 and 74 come in planar contact with the flat planar surfaces 26 and 44 of the end effector arms 12 and 14, respectively.

If the cassette 70 is off center, the reinforcement bars 76 and 74 will contact one or more of the ramped walls 28-32 and 46-50. The angle of the ramped walls causes the reinforcement bars 76 and 74 to slide off the ramped walls and onto the flat planar surfaces 26 and 44, thus allowing the cassette 70 to maintain a level and aligned position between the end effector arms 12 and 14.

Various modifications can be made to the present invention without departing from the apparent scope thereof.

I claim:

1. A passive cassette robotic end effector for handling an end of a wafer cassette for semiconductor substrates comprising:
    a. a pair of spaced end effector arms, each a mirror image of the other, and each of said end effector arms including a longitudinal member perpendicular to a mounting flange, said mounting flange secured to a robotic handle mounting plate, and a cavity means therein for accommodation of the opposing reinforcement bars of the wafer cassette; and,
    b. said cavity means including a planar surface upon which the reinforcement bar of the wafer cassette engages, ramped vertical walls with a longer ramped vertical wall and two shorter ramped vertical walls which intersect said planar surface, said ramped longer vertical wall and said ramped shorter vertical walls guide the wafer cassette reinforcement bars to rest on said planar surface, said shorter walls are angled with respect to said longer walls providing for engagement with the reinforcement bars.

2. Effector of claim 1 wherein said arms and said mounting plate are Teflon.

* * * * *

UNITED STATES PATENT AND TRADEMARK OFFICE
CERTIFICATE OF CORRECTION

PATENT NO.   : 4,854,623
DATED        : Aug. 8, 1989
INVENTOR(S)  : Molinaro

It is certified that error appears in the above—identified patent and that said Letters Patent is hereby corrected as shown below:

On the title page:

Item [73] Assignee: "Dexton, Inc. Minneapolis, Minn." should read
--Dexon, Inc., Minneapolis, Minn.--.

Signed and Sealed this

Twenty-second Day of January, 1991

Attest:

HARRY F. MANBECK, JR.

*Attesting Officer*     *Commissioner of Patents and Trademarks*